(12) United States Patent
Chang et al.

(10) Patent No.: US 8,507,311 B2
(45) Date of Patent: Aug. 13, 2013

(54) METHOD FOR FORMING AN IMAGE SENSING DEVICE

(71) Applicant: Himax Imaging, Inc., Grand Cayman (KY)

(72) Inventors: Chang-Wei Chang, Grand Cayman (KY); Fang-Ming Huang, Grand Cayman (KE); Chi-Shao Lin, Grand Cayman (KE); Yu-Ping Hu, Grand Cayman (KY)

(73) Assignee: Himax Imaging, Inc., Grand Cayman (KY)

( * ) Notice: Subject to any disclaimer, the term of this patent is extended or adjusted under 35 U.S.C. 154(b) by 0 days.

(21) Appl. No.: 13/733,246

(22) Filed: Jan. 3, 2013

(65) Prior Publication Data

US 2013/0122636 A1    May 16, 2013

Related U.S. Application Data

(62) Division of application No. 12/898,419, filed on Oct. 5, 2010, now Pat. No. 8,368,160.

(51) Int. Cl.
*H01L 21/426* (2006.01)

(52) U.S. Cl.
USPC ...... 438/73; 257/440; 257/443; 257/E27.133; 257/E31.068; 257/E21.147; 438/526; 438/527

(58) Field of Classification Search
USPC .................. 257/440, 443, E27.133, E27.135, 257/E31.068, E21.147; 438/73, 74, 526, 438/527
See application file for complete search history.

(56) References Cited

U.S. PATENT DOCUMENTS

| | | | |
|---|---|---|---|
| 6,610,557 B2 * | 8/2003 | Lee et al. | 438/87 |
| 7,253,461 B2 | 8/2007 | Yang et al. | |
| 7,388,187 B1 | 6/2008 | Liu et al. | |
| 7,453,110 B2 * | 11/2008 | Hwang | 257/291 |
| 7,541,627 B2 | 6/2009 | Hynecek et al. | |
| 7,760,254 B2 | 7/2010 | Suzuki | |
| 7,812,381 B2 * | 10/2010 | Park | 257/291 |
| 7,880,257 B2 | 2/2011 | Lee | |
| 8,357,984 B2 * | 1/2013 | Mao et al. | 257/447 |
| 2005/0087829 A1 * | 4/2005 | Merrill et al. | 257/440 |
| 2005/0139833 A1 | 6/2005 | Janesick et al. | |
| 2006/0244020 A1 | 11/2006 | Lee | |
| 2007/0084986 A1 | 4/2007 | Yang et al. | |
| 2007/0131992 A1 | 6/2007 | Dosluoglu et al. | |
| 2008/0149976 A1 | 6/2008 | Lim | |
| 2008/0157139 A1 * | 7/2008 | Lee | 257/292 |
| 2009/0302360 A1 | 12/2009 | Shinomiya | |
| 2010/0084692 A1 | 4/2010 | Mao et al. | |
| 2011/0249158 A1 | 10/2011 | Hynecek | |

* cited by examiner

*Primary Examiner* — Allan R Wilson
(74) *Attorney, Agent, or Firm* — McClure, Qualey & Rodack, LLP

(57) ABSTRACT

A method for forming an image sensing device is disclosed. An epitaxy layer having the first conductivity type is formed on a substrate, wherein the epitaxy layer comprises a first pixel area corresponding to a first incident light, a second pixel area corresponding to a second incident light, and a third pixel area corresponding to a third incident light. A first deep well is formed in a lower portion of the epitaxy layer for reducing pixel-to-pixel talk of the image sensing device. A second deep well is formed in a lower portion of the epitaxy layer.

10 Claims, 18 Drawing Sheets

US 8,507,311 B2

METHOD FOR FORMING AN IMAGE SENSING DEVICE

CROSS REFERENCE TO RELATED APPLICATIONS

This application is a Divisional of pending U.S. patent application Ser. No. 12/898,419, filed Oct. 5, 2010 and entitled "IMAGE SENSING DEVICE AND FABRICATION THEREOF".

BACKGROUND OF THE INVENTION

1. Field of the Invention

The present invention relates to an image sensing device and to a method of fabricating the same, and more particularly, to an image sensing device having reduced pixel-to-pixel crosstalk and quantum efficiency, and a method of fabricating the same.

2. Description of the Related Art

An image sensor converts optical information into electrical signals. Recently, with advanced development of the computer and communications industries, there has also been an increasing demand for more highly-efficient image sensors for various fields such as digital cameras, camcorders, personal communication systems, game devices, surveillance cameras, micro-cameras for medical use, robots, and so on.

A unit pixel in an image sensor converts incident light into an electrical signal, and integrates charges corresponding to the amount of light at a photoelectric converter. In addition, a unit pixel of an image sensor reproduces an image signal through a readout operation. However, the incident light may form charges that are not integrated at the photoelectric converter of the unit pixel. For example, in a CMOS image sensor, charges may be moved to and integrated at a photoelectric converter of an adjacent pixel, causing what is known as pixel-to-pixel crosstalk.

Referring to FIG. 1, pixel-to-pixel crosstalk may be divided into the following categories: (a) optical crosstalk A, which occurs when a reflected light 6 is transmitted to a photoelectric converter 2 of a unit pixel adjacent to a relevant unit pixel, a reflected light 6 is formed by reflection from a top or side of metal wirings M1, M2, and M3, or a refractive light is formed by refraction at a non-uniform layer or at a multi-layered structure including interlayer insulating layers having different refractive indexes; and (b) electrical crosstalk B, which occurs when charges generated at a lower or side portion of a photoelectric converter 2 of a relevant unit pixel are delivered to the photoelectric converter 2 of an adjacent unit pixel via a long-wavelength incident light 7.

For a black and white image sensor, when crosstalk occurs, resolution decreases causing image distortion. Meanwhile, for a color image sensor using an RGB color filter array (CFA), the probability for crosstalk to occur due to red light having a long wavelength is high, which may cause poor tint quality. Moreover, crosstalk may cause blooming effect in which adjacent pixels for an image are blurred.

BRIEF SUMMARY OF INVENTION

A method for forming an image sensing device is disclosed. A substrate having a first conductivity type is provided. An epitaxy layer having the first conductivity type is formed on the substrate, wherein the epitaxy layer comprises a first pixel area corresponding to a first incident light, a second pixel area corresponding to a second incident light, and a third pixel area corresponding to a third incident light, wherein wavelength of the first incident light is longer than that of the second incident light and the wavelength of the second incident light is longer than that of the third incident light. A first deep well is formed in a lower portion of the epitaxy layer for reducing pixel-to-pixel talk of the image sensing device by implantation using a mask, wherein the mask has a cover corresponding to the first pixel area and a portion of the mask corresponding to the second pixel area and the third pixel area are exposed, such that the implanting process can form the first deep well at least in the second pixel area and the third pixel area of the epitaxy layer, and at least a portion of the first pixel area does not comprise the first deep well. A second deep well is formed in a lower portion of the epitaxy layer, wherein the second deep well is at least disposed in the first, second and third pixel area, and the portion of the first pixel area not comprising the first deep well comprises the second deep well. A photodiode is formed in an upper portion of the epitaxy layer.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
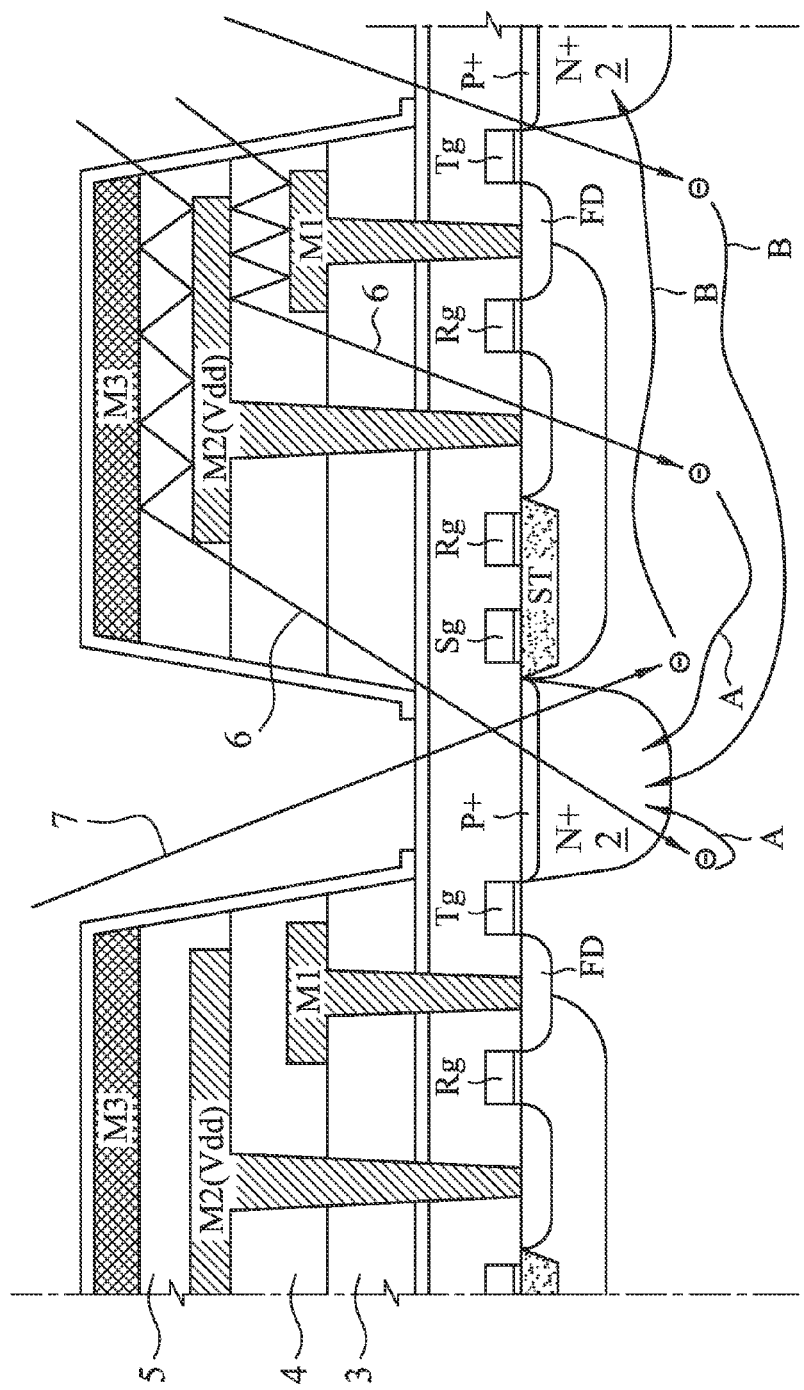
FIG. 1 shows a cross section of a conventional image sensing device.
Figure 2:
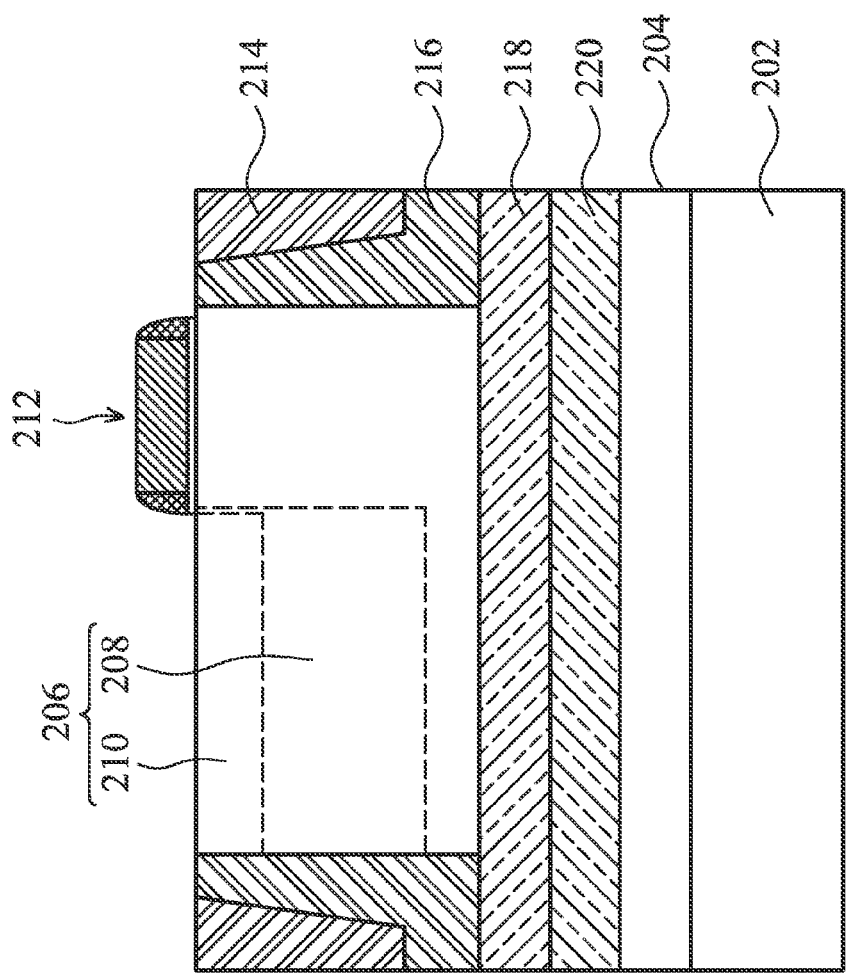
FIG. 2 is a cross section of a pixel of an image sensor having some issues found by the inventor.

FIG. 2 is a cross section of a pixel of an image sensor having some issues found by the inventor. Following a description of FIG. 2, problems found in the fabrication method thereof will be highlighted. Referring to FIG. 2, a p-type epitaxy layer 204 is grown on a p-type substrate 202. A photodiode 206 comprising an n well 208 and p-type pin layer 210 is disposed in the p-type epitaxy layer 204 with one side neighboring a transfer gate 212. The photo diode 206 of the pixel is isolated from other pixels by a shallow trench isolation 214, isolating p well 216 thereunder. In order to suppress pixel-to-pixel cross talk, the p-type epitaxy layer 204 is further implanted to form a pixel deep p well (DPW) 218 and a pixel deep n well (DNW) 220 under the photodiode 206.

Figure 3:
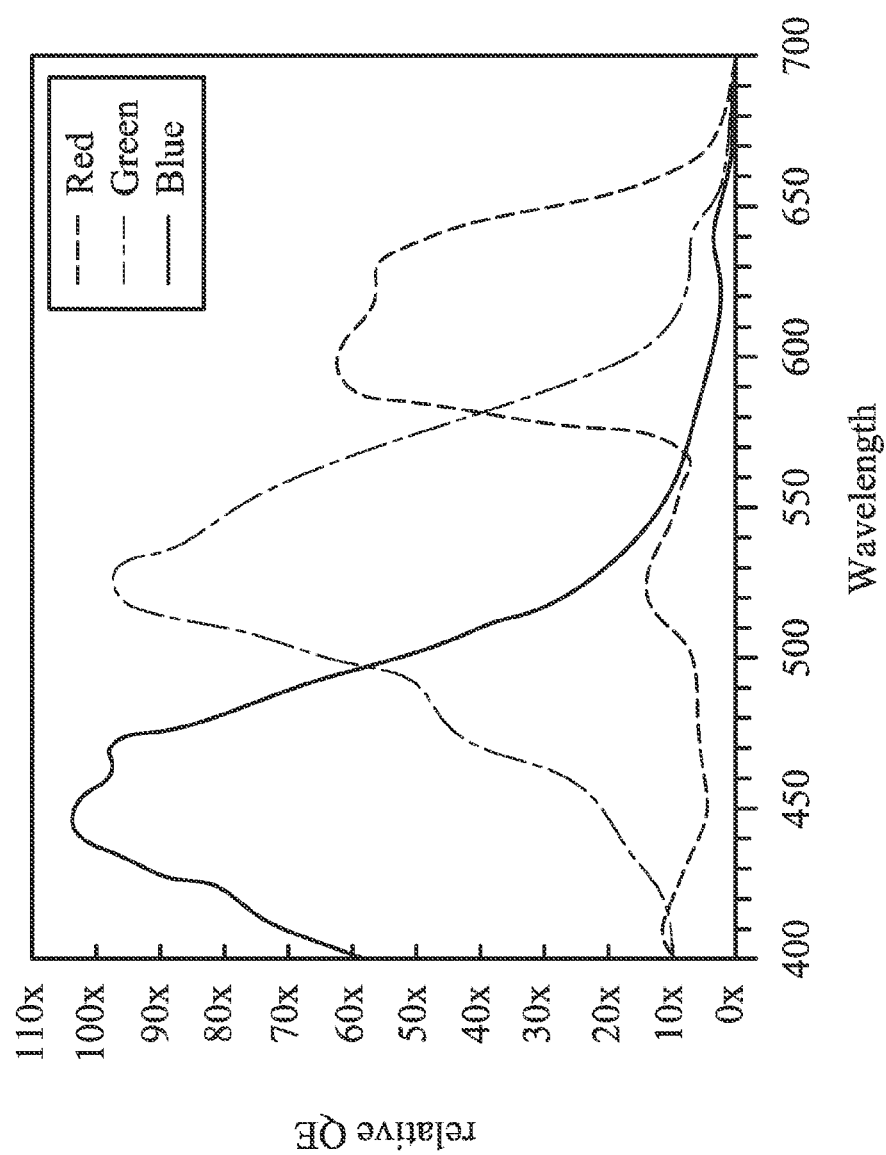
FIG. 3 shows a curve diagram with relative quantum efficiency (QE) as a function of wavelength of R, G, B color light.

FIG. 3 is a curve diagram with relative quantum efficiency (QE) as a function of wavelength of R, G, B color light. In FIG. 3, it is shown that pixel-to-pixel cross talk is suppressed, but the image sensor has low quantum efficiency for long-wave light (red light). The pixel deep p well 218 and pixel deep n well 220 form a potential barrier so that charges generated deep in the lower area of the epitaxy layer 204 are prevented from flowing into the photodiodes of adjacent pixels. Thus, the pixel deep p well 218 and pixel deep n well 220 hinders pixel-to-pixel crosstalk caused by randomly drifting charges.

For example, the deep p well and the deep n well may have a maximum concentration at a depth of about 3-10 μm from a surface of the epitaxy layer and may have a thickness of about 1-5 μm. Here, the depth of about 3-10 μm is substantially the same as an absorption length of red or near infrared region light. When the depth of the deep p well 218 and the deep n well 220 from the surface of the epitaxy layer 204 becomes shallow, a diffusion prevention effect increases, and therefore, crosstalk decreases. However, since the photo diode 206 also become shallow, sensitivity with respect to incident light having a long wavelength (e.g., a red wavelength) that has a high photoelectric conversion rate at a deep region may decrease. Accordingly, although the method described above reduce pixel-to-pixel crosstalk, quantum efficiency is sacrificed for light propagating at longer wavelengths, especially for red light. In addition, an R, G, B color quantum efficiency gap is generated, which hinders image signal processing.

Figure 4A:
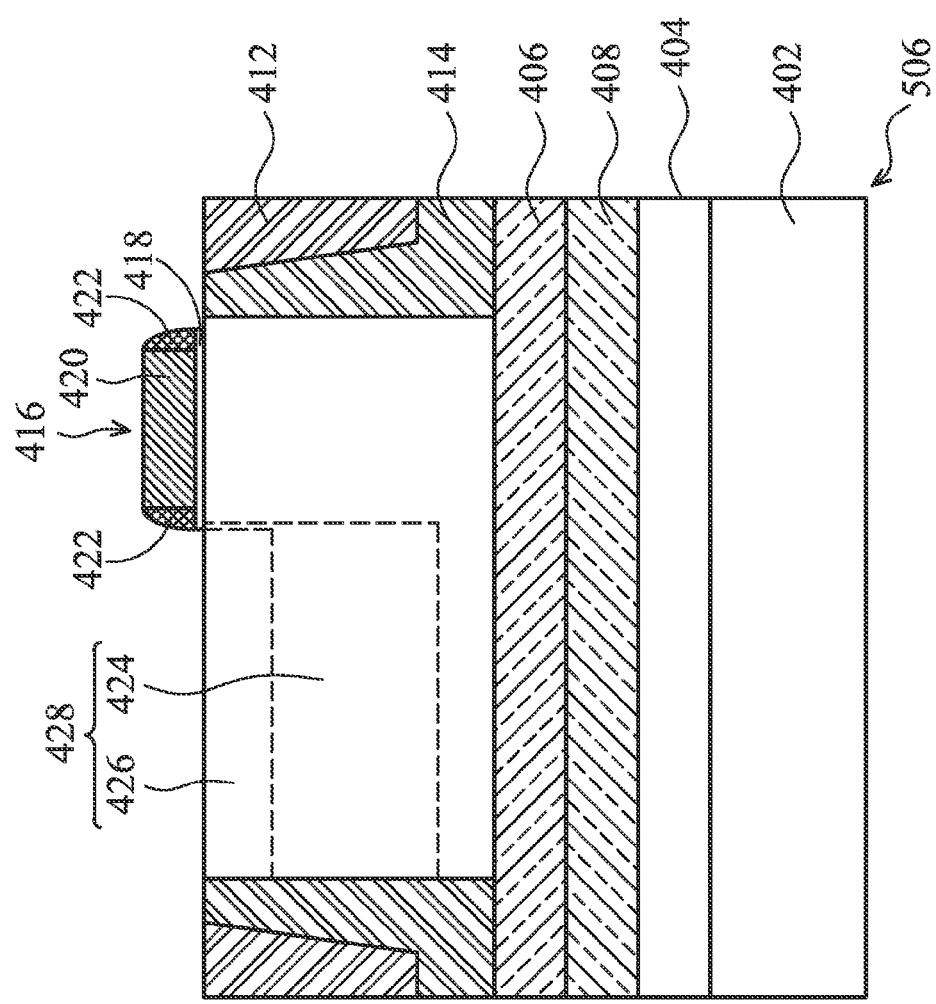
FIG. 4A shows a cross section of a green pixel of an image sensing device of an embodiment of the invention.
Figure 4B:
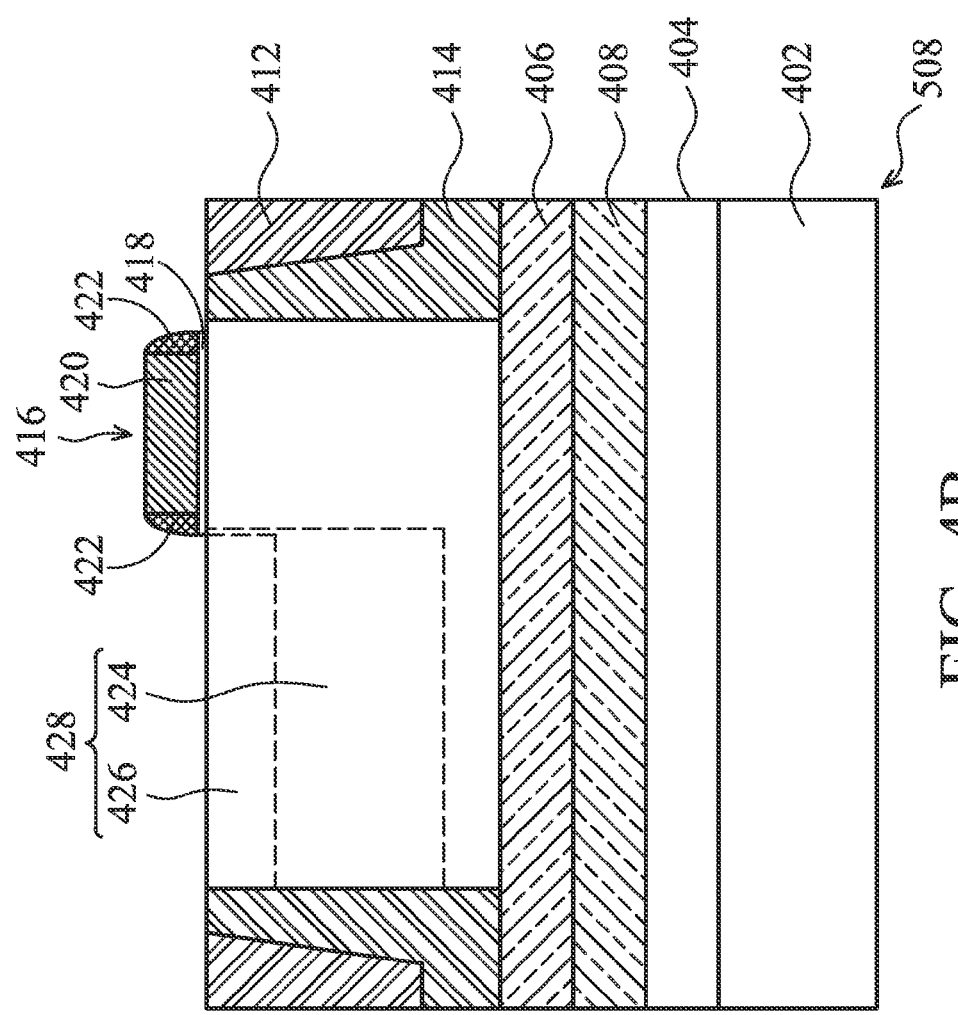
FIG. 4B shows a cross section of a blue pixel of an image sensing device of an embodiment of the invention.
Figure 4C:
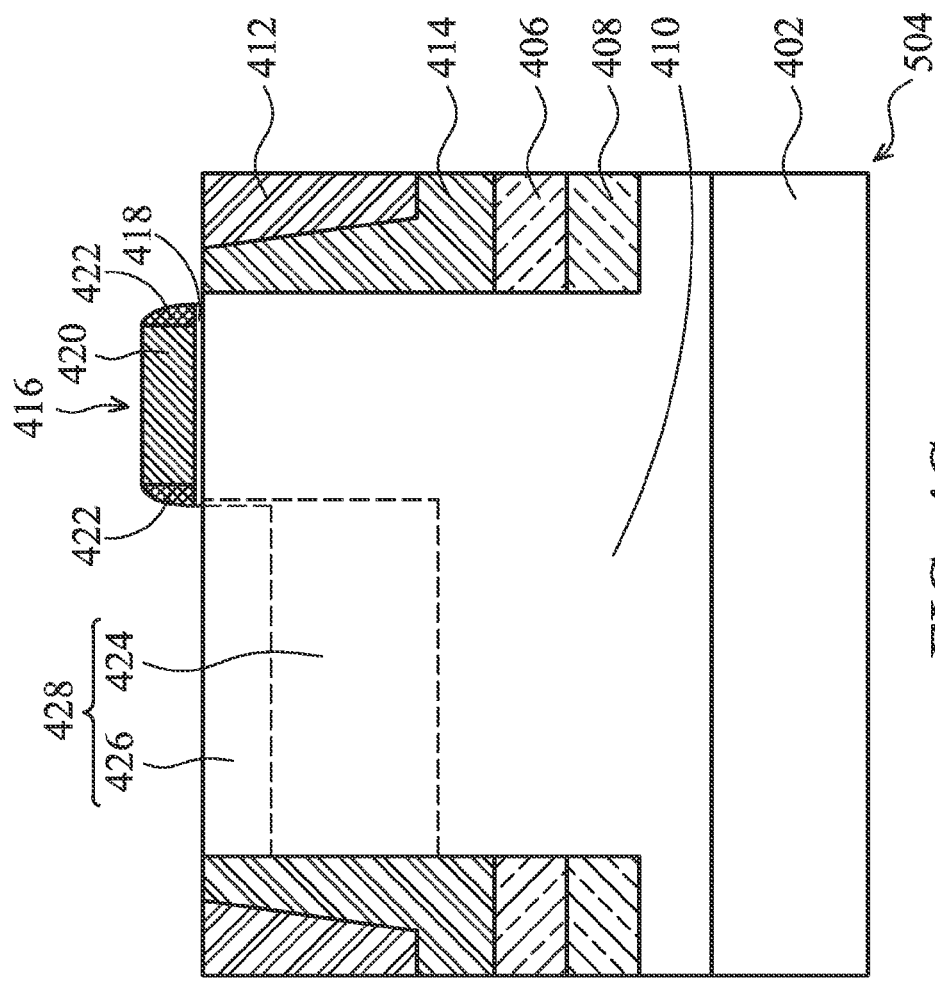
FIG. 4C shows a cross section of a red pixel of an image sensing device of an embodiment of the invention.
Figure 5:
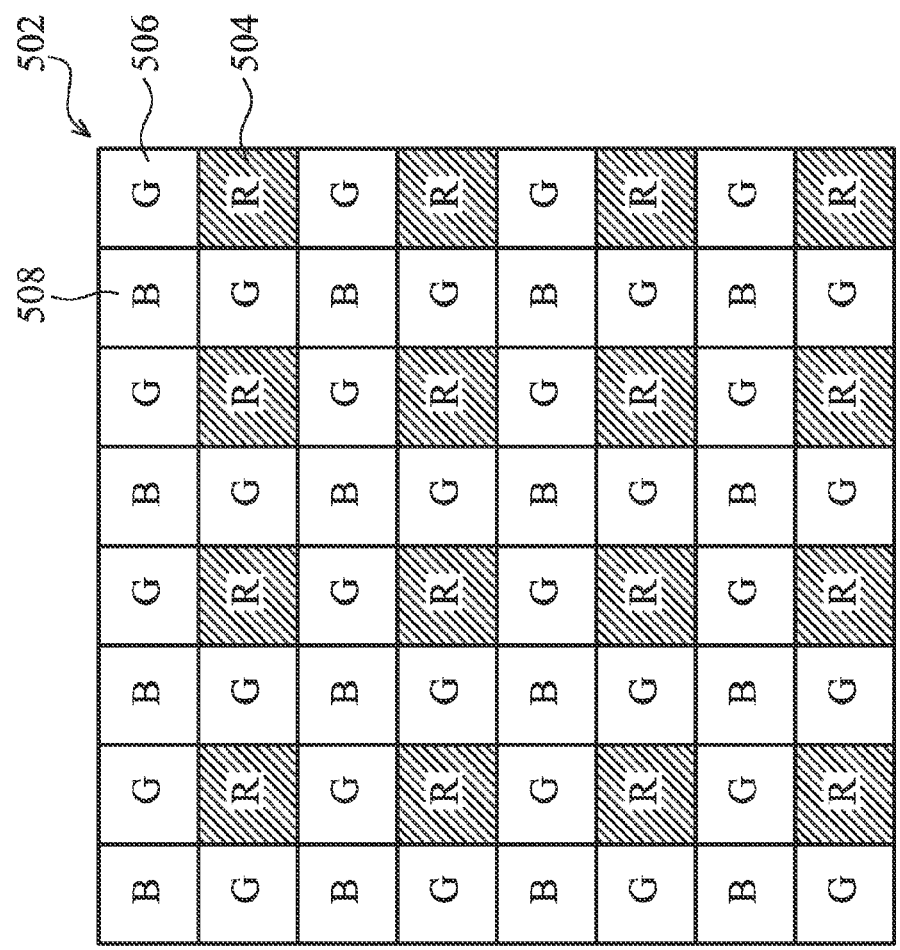
FIG. 5 shows a novel pixel buried well mask of an embodiment of the invention.
Figure 6:
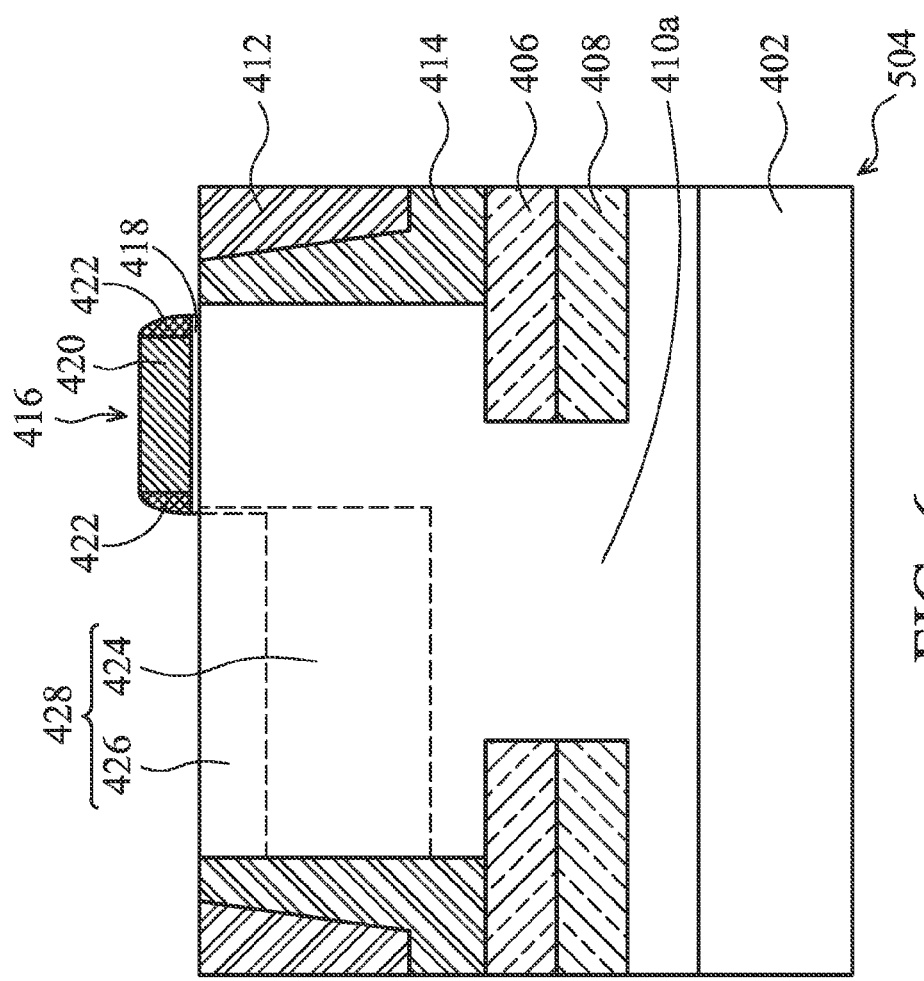
FIG. 6 shows a cross section of a red pixel of an image sensing device of another embodiment of the invention.
Figure 7:
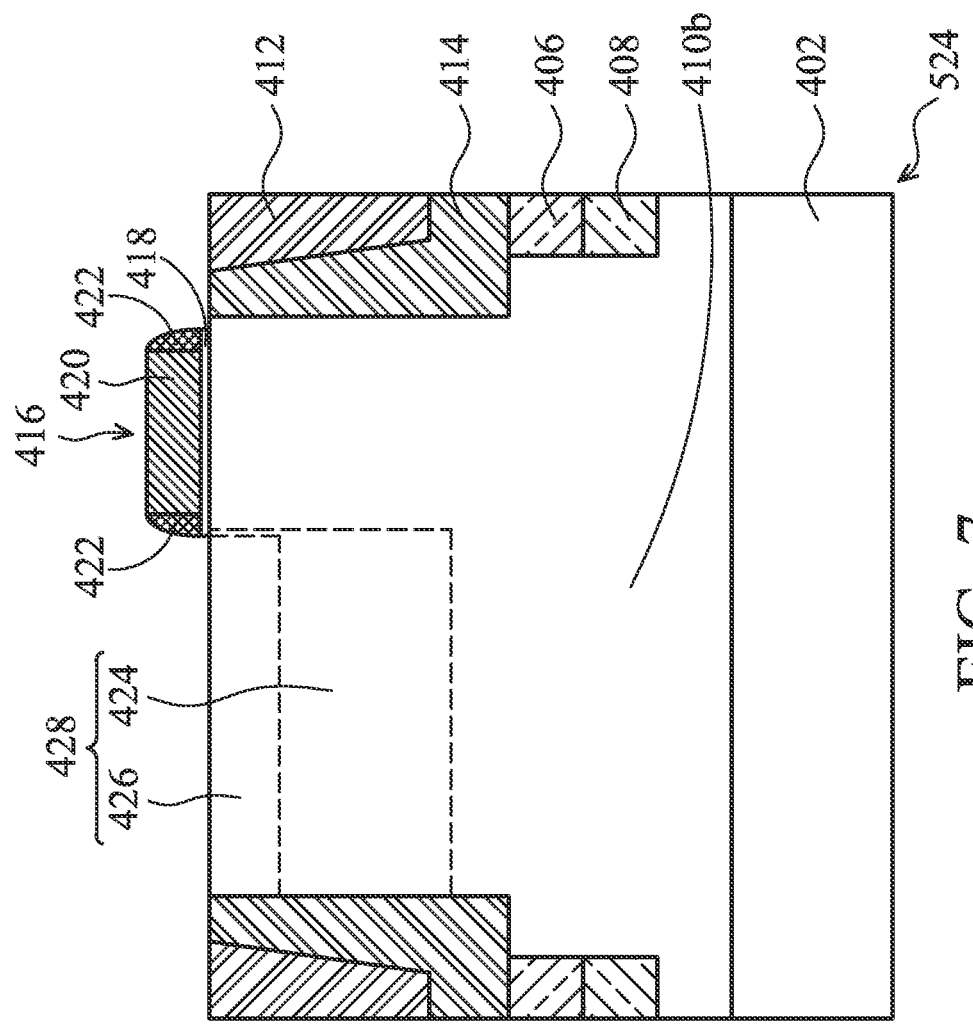
FIG. 7 shows a cross section of a red pixel of an image sensing device of further another embodiment of the invention.

FIG. 4A~FIG. 4C are cross sections of a green pixel, a blue pixel and a red pixel of an image sensing device which can suppress cross talk, while maintaining good quantum efficiency of an embodiment of the invention. FIG. 4A shows a green pixel structure, FIG. 4B shows a blue pixel structure, and FIG. 4C shows a red pixel structure. In FIG. 4A, FIG. 4B and FIG. 4C, a substrate 402 is provided. The substrate 402 can be a p-type substrate, for example comprising boron. A p-type epitaxy layer 404 is grown on the substrate 402. The p-type epitaxy layer 404 can be doped with boron and can be formed on the substrate 402 by chemical vapor deposition (CVD) or molecular beam epitaxy (MBE). In an embodiment, the p-type epitaxy layer 404 can be about 3-10 μm thick. The p-type epitaxy layer 404 is implanted using a novel pixel buried well mask 502 (the mask as FIG. 5) to form a deep p well 406 and a deep n well 408 under the deep p well 406. Note that the mask 502 in FIG. 5 has covers corresponding to a red pixel area 504, wherein a green pixel area 506 and a blue pixel area 508 are exposed. Therefore, the ion implantation process can only dope the epitaxy layer 404 in the green pixel area 506 and the blue pixel area 508 to form a deep p well 406 and a deep n well 408, and a least a portion of the red pixel area 504 is not doped. In other words, the image sensor of the embodiment has a deep p well 406 and a deep n well 408 in the green pixel area 506 and blue pixel area 508, but at least a portion of the red pixel area 504 does not comprise the deep p well and the deep n well. The size of the area 410 without the deep p well and the deep n well in the red pixel 504 can be dependant upon product specifications or process conditions. In an embodiment, as shown in FIG. 6, the size of the area 410a without the deep p well and the deep n well is less than the pixel area. In an alternative embodiment, as shown in FIG. 7, the size of the area 410b without the deep p well and the deep n well is larger than the pixel area.

Referring back to FIG. 4A, FIG. 4B and FIG. 4C, an isolation structure 412 is formed in the epitaxy layer 404. The isolation structure 412 can be a shallow trench isolation (STI) or a field oxide. Preferably, the isolation structure 412 is a shallow trench isolation (STI) structure. An isolating p well 414 is formed under the isolation structure 412 by ion implantation. A transfer gate 416 is formed on a surface of the epitaxy layer 404. In an embodiment, the transfer gate 416 can comprise a gate dielectric layer 418, a gate conductive layer 420 on the gate dielectric layer 418, and spacers 422 on sidewalls of the gate conductive layer 420. The transfer gate can be formed by the following steps. First, a gate dielectric layer 418 is formed on the epitaxy layer 404. Next, a gate conductive layer 420 is formed on the gate dielectric layer 418. Following, the gate conductive layer 418 and the gate dielectric layer 420 are patterned by a lithography and etching process. Next, a spacer layer (not shown) is deposited on the gate conductive layer 420 and the epitaxy layer 404. Following, the spacer layer is etched to form spacers 422 on sidewalls of the gate conductive layer 420. The epitaxy layer 404 is implanted to form an n well 424 and a p-type pin layer 426, thus forming a photodiode 428.

The described image sensing device of the invention addresses the issue concerning decreased sensitivity with respect to incident light having long wavelengths (e.g., a red wavelength) that has a high photoelectric conversion rate at deep region. As well, the described image sensing device and fabrication method thereof of the invention, improves quantum efficiency with good R, G, and B color balance, when compared to conventional methods, while reducing crosstalk, without adding extra process steps and negatively effecting pixel performance.

Figure 8A:
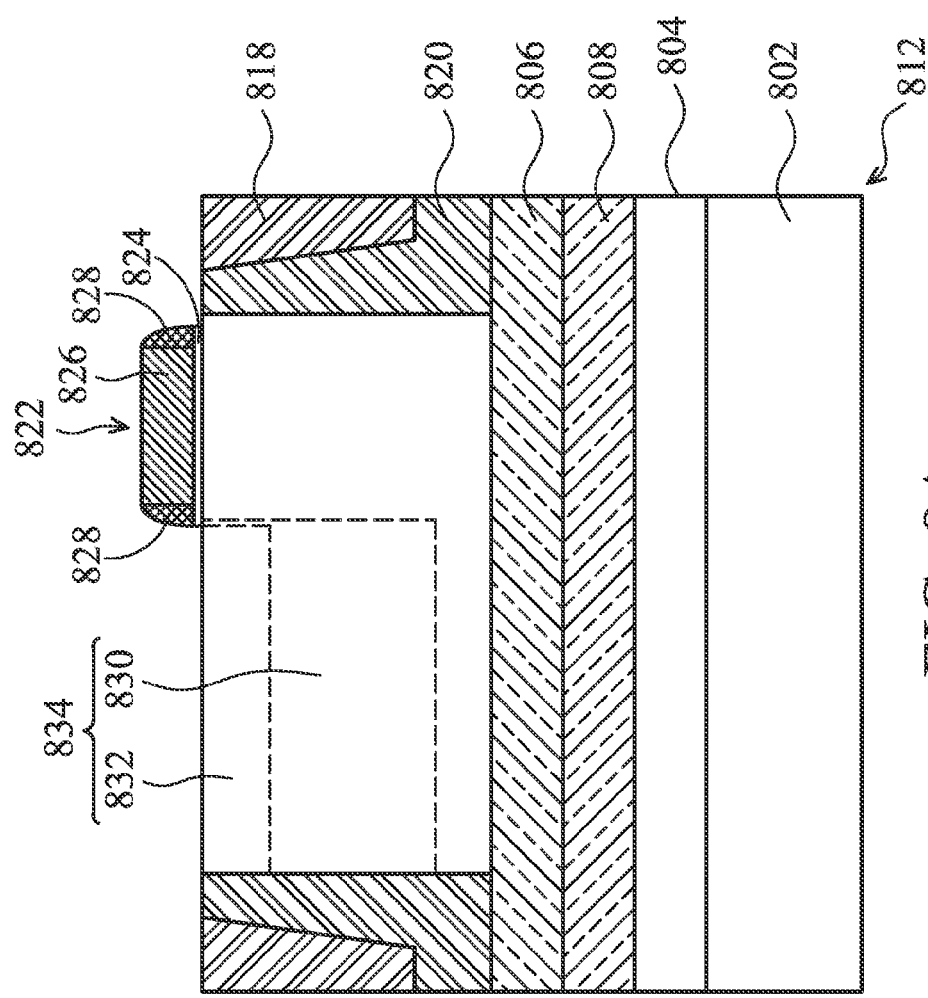
FIG. 8A shows a cross section of a green pixel of an image sensing device of another embodiment of the invention.
Figure 8B:
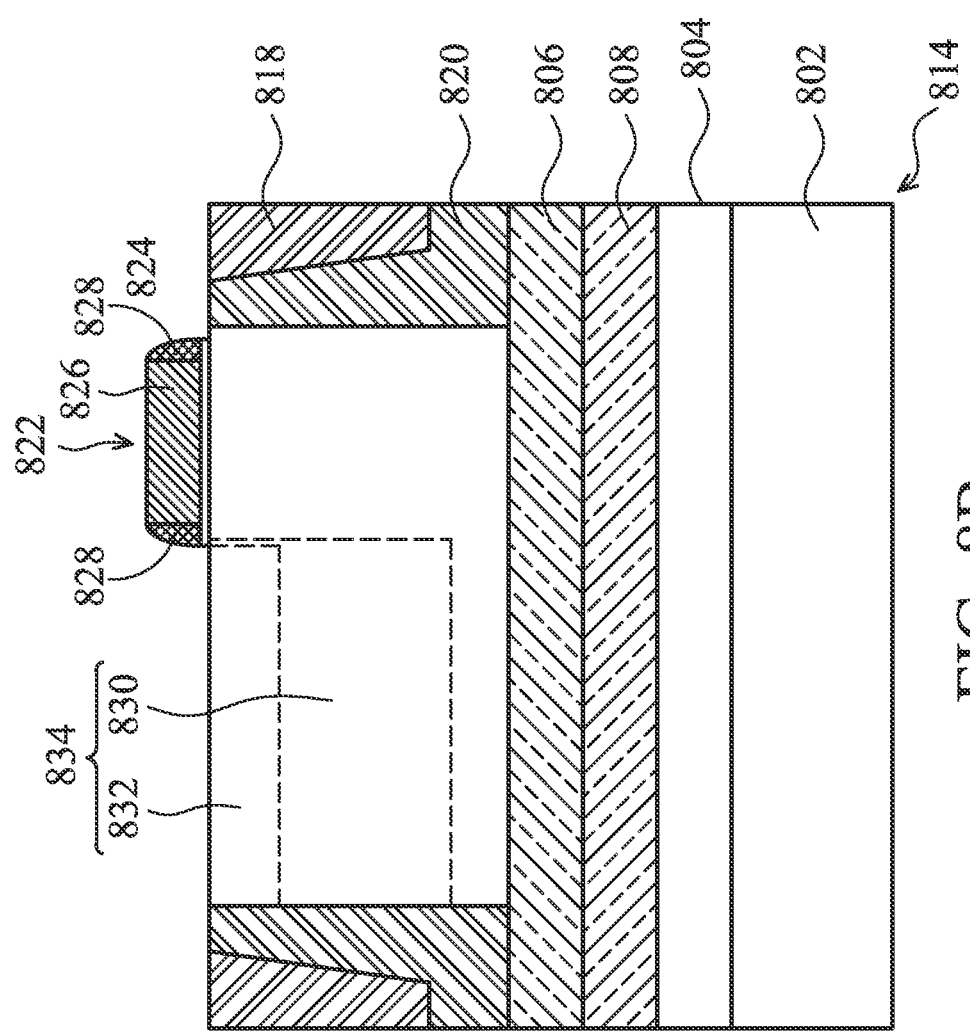
FIG. 8B shows a cross section of a blue pixel of an image sensing device of another embodiment of the invention.
Figure 8C:
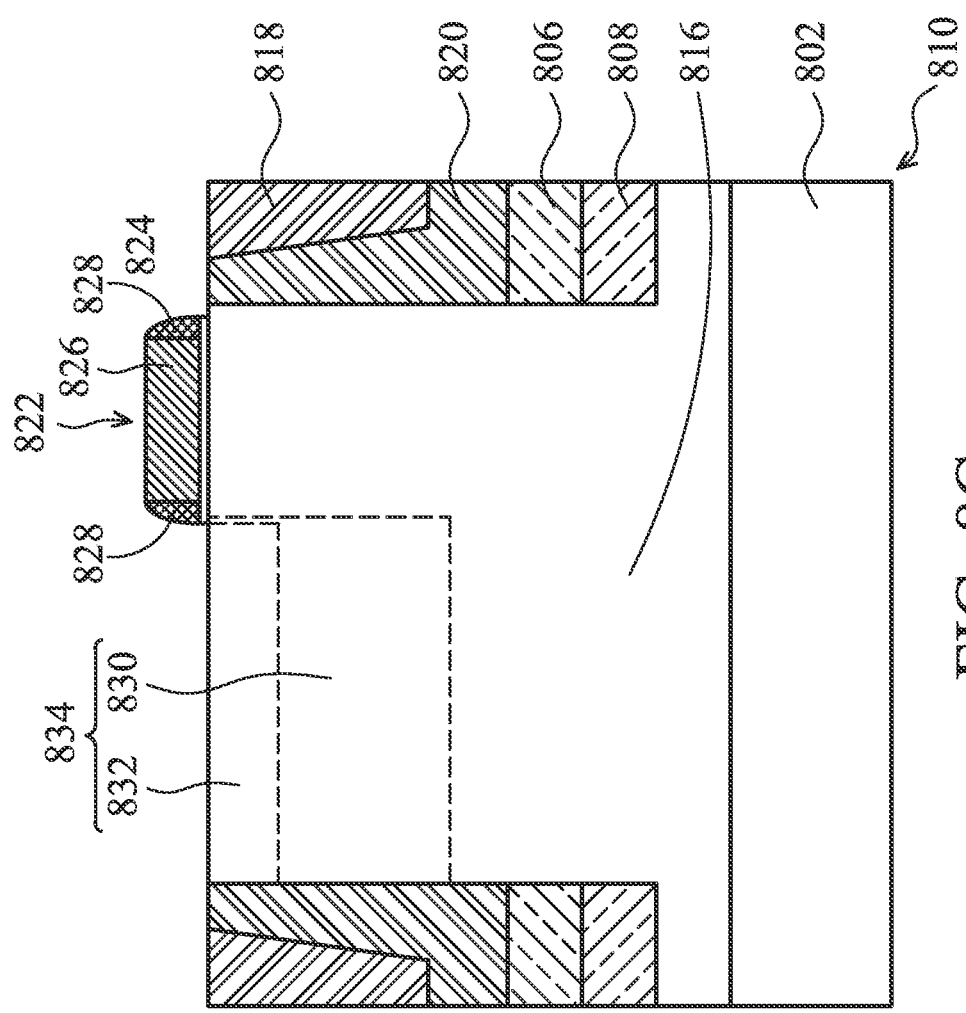
FIG. 8C shows a cross section of a red pixel of an image sensing device of another embodiment of the invention.

The embodiments described disclose n-type image sensing devices. The invention, however, is not limited thereto. A p-type image sensing device may also utilize the fabrication method of the invention. FIG. 8A~FIG. 8C are cross sections of a green pixel, a blue pixel and a red pixel, respectively, showing reduced cross talk, while maintaining good quantum efficiency of a p-type image sensor of an embodiment of the invention. FIG. 8A shows a green pixel structure, FIG. 8B shows blue pixel structure, and FIG. 8C shows a red pixel structure. In FIG. 8A, FIG. 8B and FIG. 8C, a substrate 802 is provided. The substrate 802 can be an n-type substrate, for example comprising phosphorous or arsenic. An n-type epitaxy layer 804 is grown on the substrate 802. In an embodiment, the n-type epitaxy layer 804 can be about 3-10 μm thick. The n-type epitaxy layer 804 is implanted using a novel pixel buried well mask to form a deep n well 806 and a deep p well 808 under the deep n well 806. Note that the novel pixel buried well mask has covers corresponding to red pixel areas 810 but the green pixel areas 812 and the blue pixel areas 814 are exposed. Therefore, the ion implantation process can dose the epitaxy layer 804 in the green pixel area 812 and the blue pixel layer 814 to form a deep n well 806 and a deep p well 808, but a least a portion of the red pixel area 810 is not doped. In other words, the image sensor of the embodiment has a deep n well 806 and a deep p well 808 in the green pixel area 812 and blue pixel area 814, but at least a portion of the red pixel area 810 does not comprise the deep n well and the deep p well. The size of the area 816 without the deep n well 806 and the deep p well 808 in the red pixel 810 can be dependant upon product specification or process conditions. In an embodiment, the size of the area 816 without the deep n well and the deep p well is less than the pixel area 810. In an alternative embodiment, the size of the area 816 without the deep n well and the deep p well is larger than the pixel area 810.

As shown in FIG. 8A, FIG. 8B and FIG. 8C, an isolation structure 818 is formed in the epitaxy layer 804. The isolation structure 818 can be a shallow trench isolation (STI) or a field oxide. Preferably, the isolation structure 818 is a shallow trench isolation (STI). An isolating n well 820 is formed under the isolation structure 818 by ion implantation. A transfer gate 822 is formed on the epitaxy layer 804. In an embodiment, the transfer gate 822 can comprise a gate dielectric layer 824, a gate conductive layer 826 on the gate dielectric layer 824, and spacers 828 on sidewalls of the gate conductive layer 826. The epitaxy layer 824 is implanted to form a p well 830 and an n-type pin layer 832, thus forming a photodiode 834.

Figure 9A:
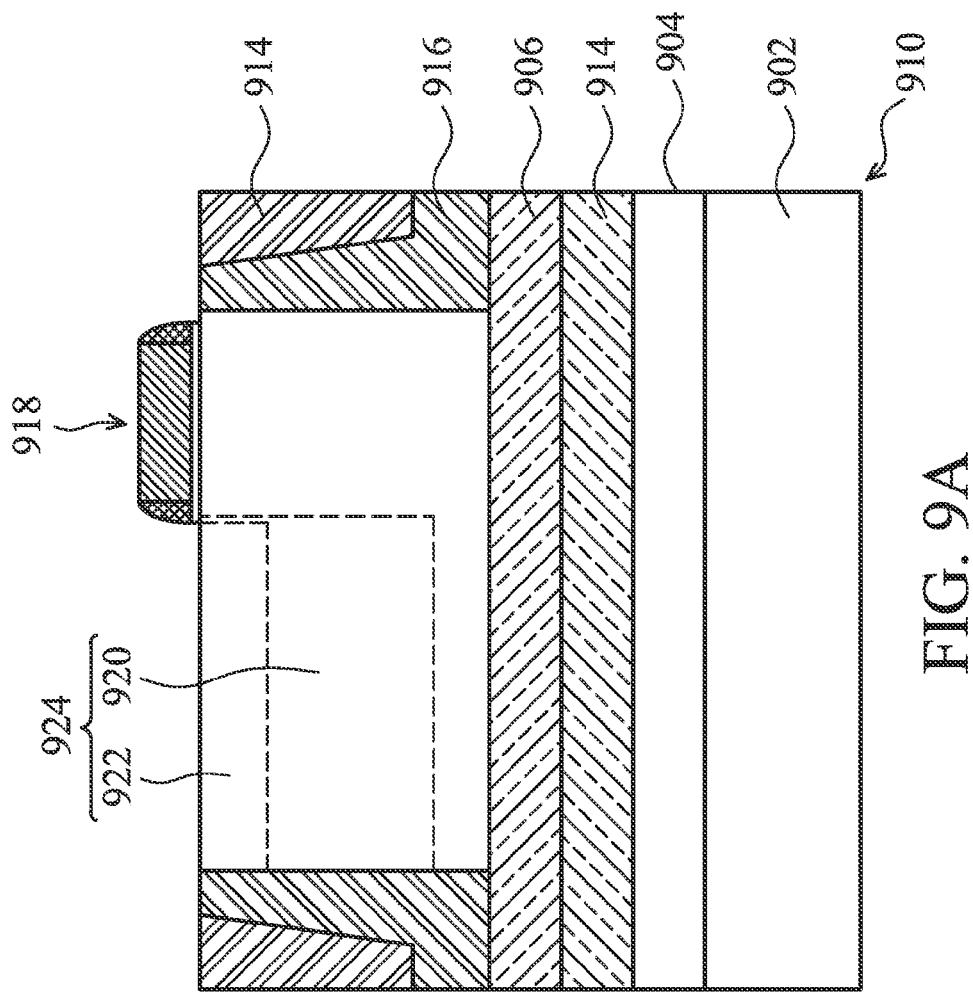
FIG. 9A shows a cross section of a green pixel of an image sensing device of further another embodiment of the invention.
Figure 9B:
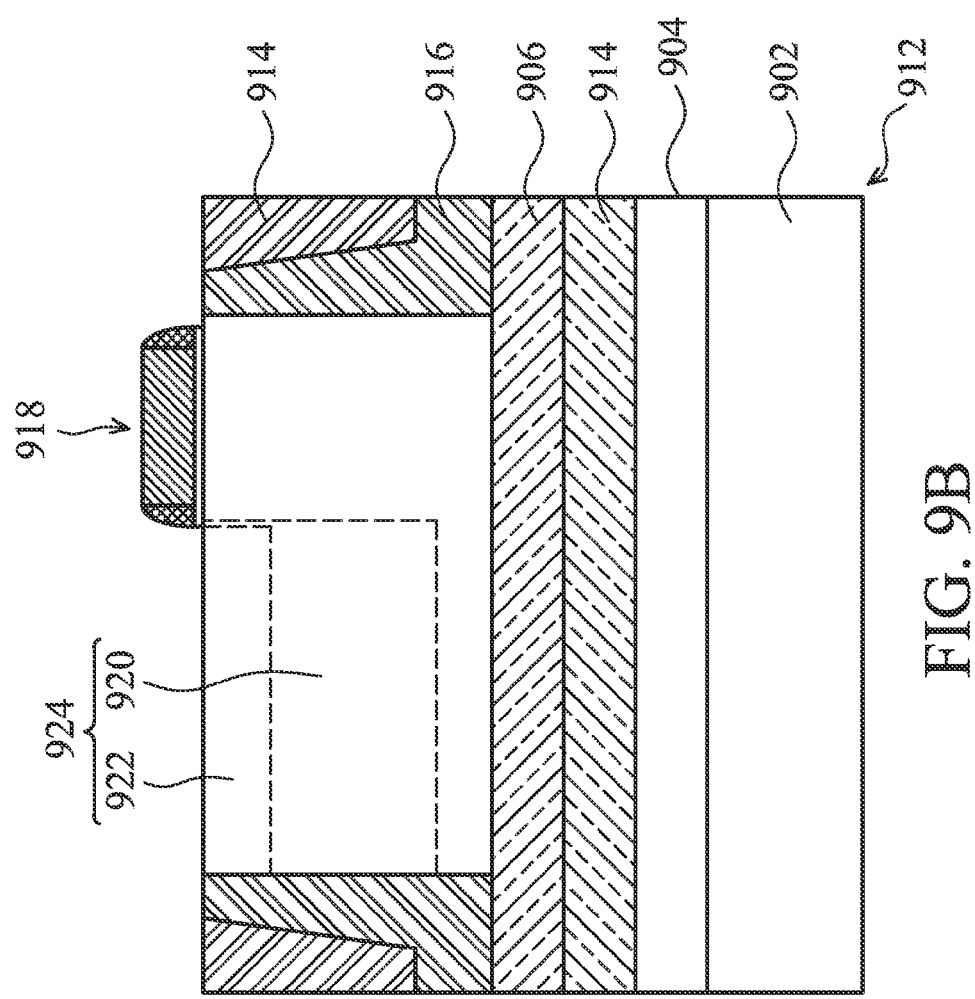
FIG. 9B shows a cross section of a blue pixel of an image sensing device of further another embodiment of the invention.
Figure 9C:
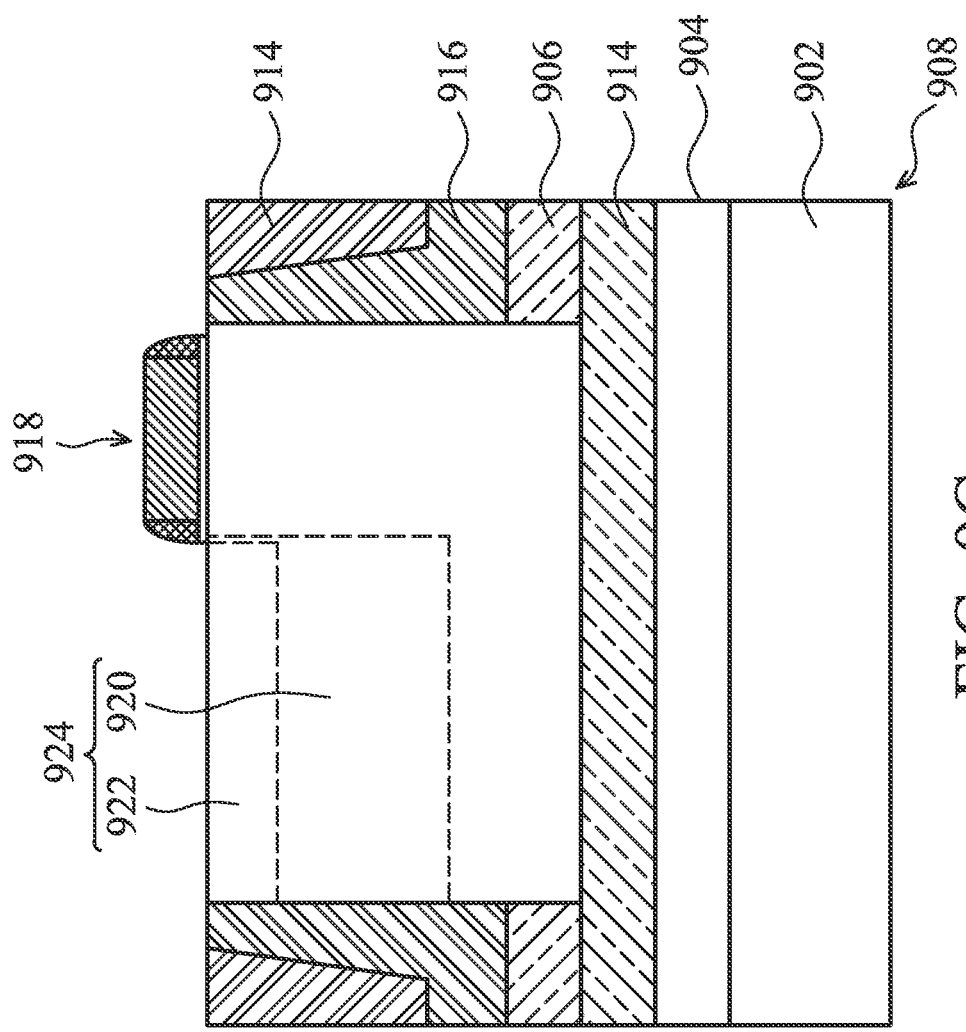
FIG. 9C shows a cross section of a red pixel of an image sensing device of further another embodiment of the invention.

FIG. 9A~FIG. 9C are cross sections of a green pixel, a blue pixel and a red pixel, respectively, of an image sensing device which can suppress crosstalk, while maintaining good quantum efficiency of another embodiment of the invention. FIG. 9A shows a green pixel structure, FIG. 9B shows a blue pixel structure, and FIG. 9C shows a red pixel structure. The difference between the embodiment in FIG. 4A~FIG. 4C and FIG. 9A~FIG. 9C is that a portion of the red pixel area does not have a deep p well and a deep n well in the embodiment in FIG. 4A~FIG. 4C, while a portion of the red pixel area only does not have deep p well but has a deep n well in the embodiment in FIG. 9A~FIG. 9C.

In FIG. 9A, FIG. 9B and FIG. 9C, a substrate 902 is provided. The substrate 902 can be a p-type substrate. A p-type epitaxy layer 904 is grown on the substrate 902. In an embodiment, the p-type epitaxy layer 904 can be about 3-10 μm thick. The p-type epitaxy layer 904 is implanted using a novel pixel buried well mask to form a deep p well 906. Note that the novel pixel buried well mask has covers corresponding to red pixel areas 908 but the green pixel areas 910 and the blue pixel areas 912 are exposed. Therefore, the ion implantation process can dose the epitaxy layer 904 in the green pixel area 910 and the blue pixel layer 912 to form a deep p well 906, wherein a least a portion of the red pixel area 908 is not doped to form the deep p well 906. In addition, the p-type epitaxy layer 904 is further implanted to form a deep n well 914 under the deep p well 906. Note that the ion implantation process doses the epitaxy layer 904 in the red, green and blue pixel area 908, 910, 912 to form deep p wells 906. As well, the image sensor in the embodiment does not comprise deep p well, but comprises deep n well 914 in the red pixel area 908. Note that both the deep p well 906 and the deep n well 914 are formed in the green and blue pixel areas.

In FIG. 9A, FIG. 9B and FIG. 9C, an isolation structure 914, such as a shallow trench isolation (STI), is formed in the epitaxy layer 904. An isolating p well 916 is formed under the isolation structure 914 by ion implantation. A transfer gate 918 is formed on the epitaxy layer 904. The epitaxy layer is implanted to form an n well 920 and a p-type pin layer 922, thus forming a photodiode 924.

Figure 10A:
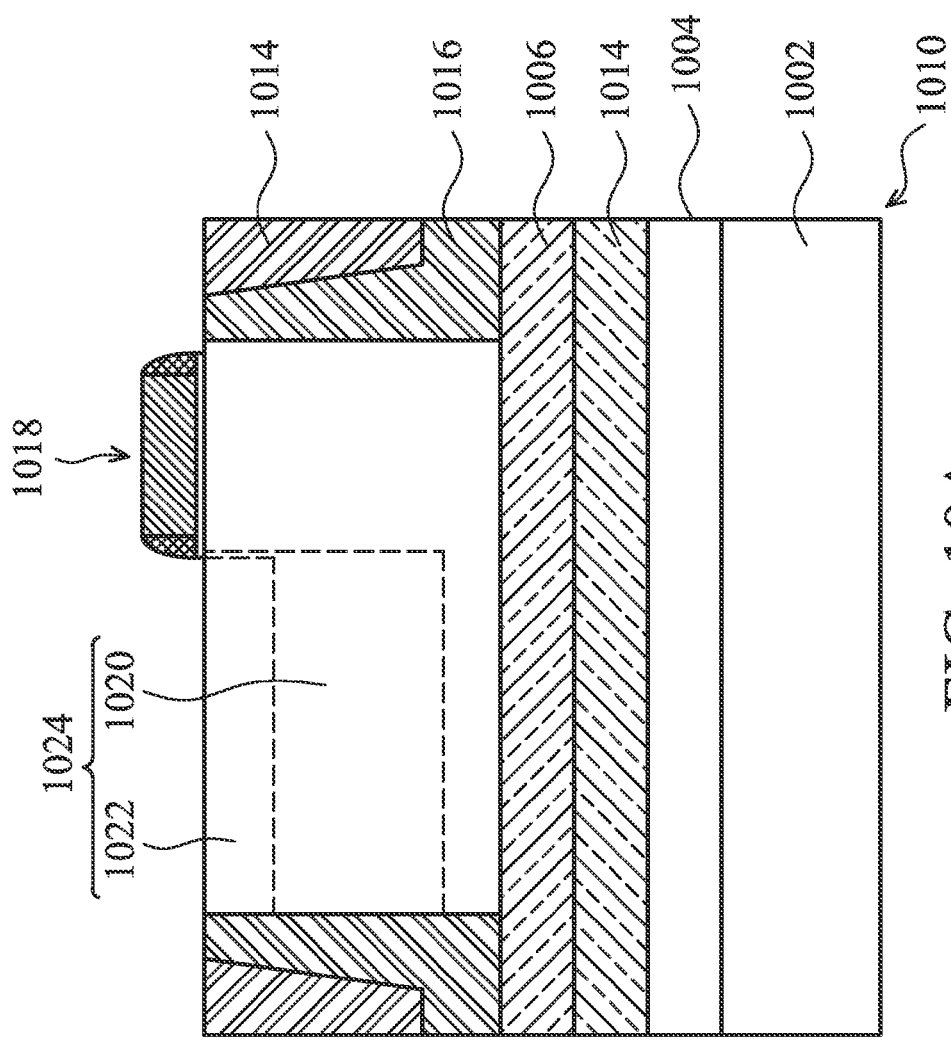
FIG. 10A shows a cross section of a green pixel of an image sensing device of yet another embodiment of the invention.
Figure 10B:
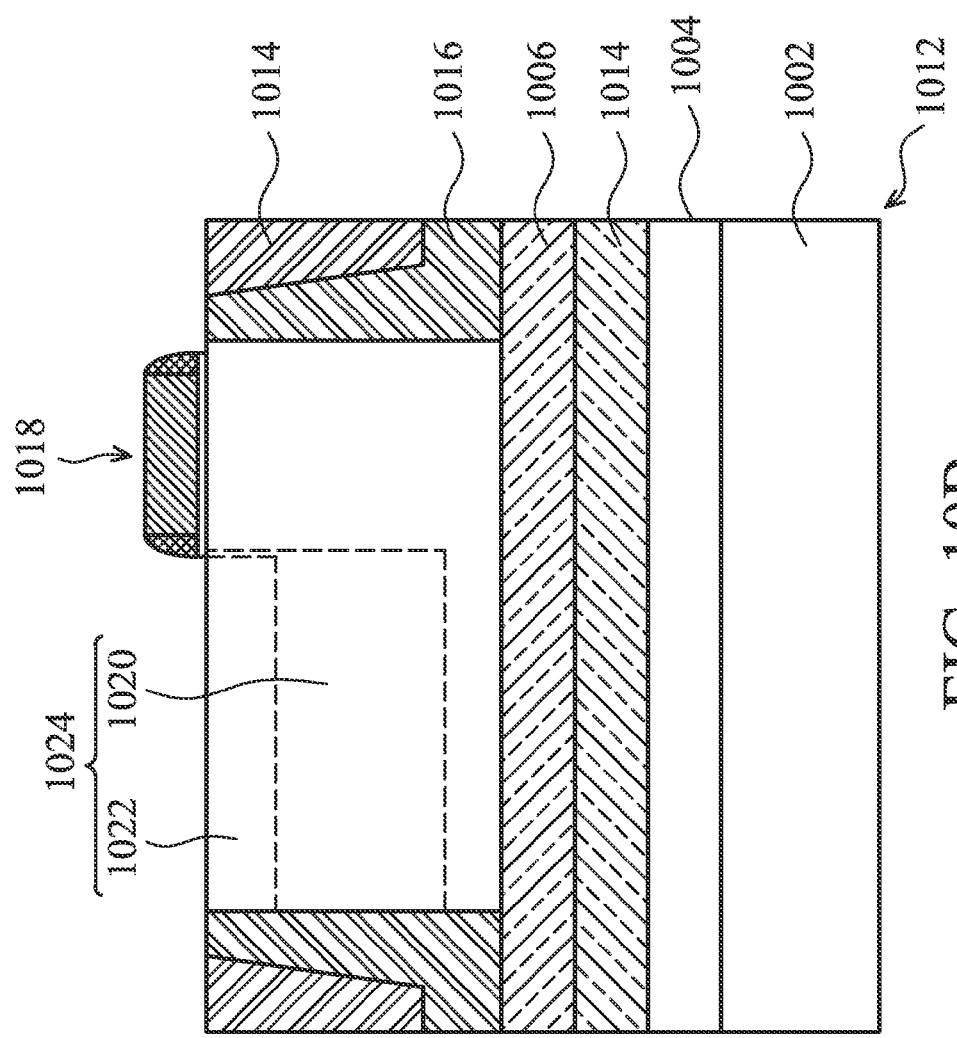
FIG. 10B shows a cross section of a blue pixel of an image sensing device of yet another embodiment of the invention.
Figure 10C:
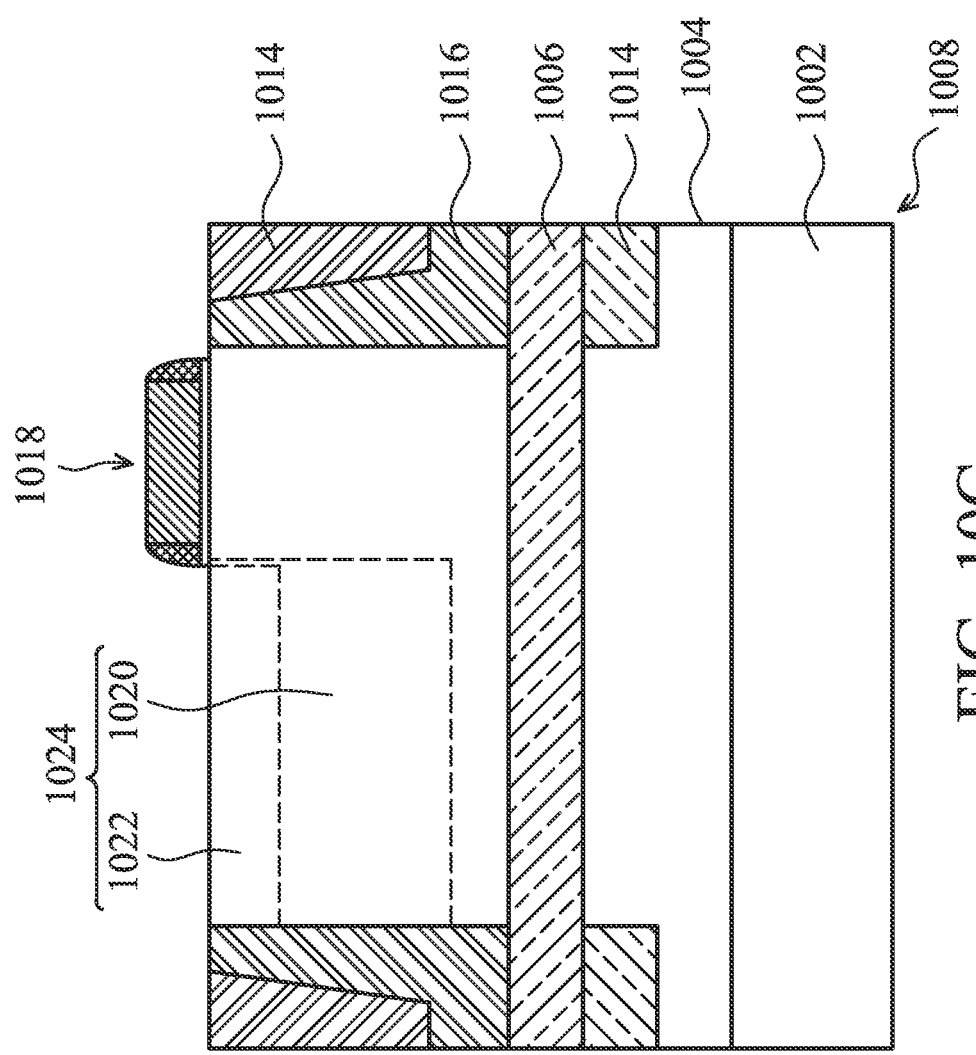
FIG. 10C shows a cross section of a red pixel of an image sensing device of yet another embodiment of the invention.

FIG. 10A~FIG. 10C are cross sections of a green pixel, a blue pixel and a red pixel of an image sensing device which can suppress crosstalk, while maintaining good quantum efficiency of yet another embodiment of the invention. FIG. 10A shows a green pixel structure, FIG. 10B shows a blue pixel structure, and FIG. 10C shows a red pixel structure. The difference between the embodiment in FIG. 4A~FIG. 4C and FIG. 10A~FIG. 10C is that a portion of the red pixel area does not have deep p well and deep n well in the embodiment in FIG. 4A~FIG. 4C, while a portion of the red pixel area only does not have deep n well but has a deep p well in the embodiment in FIG. 10A~FIG. 10C.

In FIG. 10A, FIG. 10B and FIG. 10C, a substrate 1002 is provided. The substrate 1002 can be a p-type substrate. A p-type epitaxy layer 1004 is grown on the substrate 1002. In an embodiment, the p-type epitaxy layer 1004 can be about 3-10 μm thick. The p-type epitaxy layer 1004 is implanted to form a deep p well 1006. Note that the deep p well 1006 is formed in the red pixel area 1008, the green pixel area 1010 and the blue pixel area 1012. The p-type epitaxy layer 1004 is implanted using a novel pixel buried well mask to form a deep n well 1014 under the deep p well 1006. Note that the novel pixel buried well mask has covers corresponding to red pixel areas 1008 but the green pixel areas 1010 and the blue pixel areas 1012 are exposed. Therefore, the ion implantation process can dose the epitaxy layer 1004 in the green pixel area 1010 and the blue pixel area 1012 to form a deep n well 1014, wherein at least a portion of the red pixel area 1008 does not comprises deep n well. As well, the image sensor in the embodiment does not comprise deep n well but comprises deep p well 1016 in the red pixel area. Note that both the deep p well 1006 and the deep n well 1014 are formed in the green pixel area 1010 and blue pixel area 1012.

In FIG. 10A, FIG. 10B and FIG. 10C, an isolation structure 1014 such as a shallow trench isolation (STI), is formed in the epitaxy layer 1004. An isolating p well 1016 is formed under the isolation structure 1014 by ion implantation. A transfer gate 1018 is formed on the epitaxy layer 1004. The epitaxy layer 1004 is implanted to form an n well 1020 and a p-type pin layer 1022, thus forming a photodiode 1024.

The described image sensing device and fabrication methods thereof of the invention improves quantum efficiency with good R, G, and B color balance, while reducing crosstalk, without adding extra process steps and negatively affecting pixel performance.

While the invention has been described by way of example and in terms of the preferred embodiments, it is to be understood that the invention is not limited to the disclosed embodiments. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming an image sensing device, comprising:

providing a substrate having a first conductivity type;

forming an epitaxy layer having the first conductivity type on the substrate, wherein the epitaxy layer comprises a first pixel area corresponding to a first incident light, a second pixel area corresponding to a second incident light, and a third pixel area corresponding to a third incident light, and wavelength of the first incident light is longer than that of the second incident light and wavelength of the second incident light is longer than that of the third incident light;

forming a first deep well in a lower portion of the epitaxy layer for reducing pixel-to-pixel talk of the image sensing device by implantation using a mask, wherein the mask has a cover corresponding to the first pixel area and a portion of the mask corresponding to the second pixel area and the third pixel area are exposed, such that the implanting process can form the first deep well at least in the second pixel area and the third pixel area of the epitaxy layer, and at least a portion of the first pixel area does not comprise the first deep well; and forming a second deep well in a lower portion of the epitaxy layer, wherein the second deep well is at least disposed in the first, second and third pixel area, and the portion of the first pixel area not comprising the first deep well comprises the second deep well; and forming a photodiode in an upper portion of the epitaxy layer.

2. The method for forming an image sensing device as claimed in claim 1, wherein the first incident light is red, the second incident light is green and the third incident light is blue.

3. The method for forming an image sensing device as claimed in claim 1, wherein the second deep well is under the first deep well, and the first deep well is the first conductivity type and the second deep well is a second conductivity type.

4. The method for forming an image sensing device as claimed in claim 3, wherein the first conductivity type is p type and the second conductivity type is n type.

5. The method for forming an image sensing device as claimed in claim 1, wherein the second deep well is above the first deep well, and the first deep well is a second conductivity type and the second deep well is the first conductivity type.

6. The method for forming an image sensing device as claimed in claim 5, wherein the first conductivity type is p type and the second conductivity type is n type.

7. The method for forming an image sensing device as claimed in claim 1, wherein the step of forming the photodiode comprises forming a well of a second conductivity type and a pin layer of the first conductivity type in the epitaxy layer.

8. The method for forming an image sensing device as claimed as claimed in claim 1, wherein the size of the area of not comprising the first deep well is greater than the size of the first pixel area.

9. The method for forming an image sensing device as claimed as claimed in claim 1, wherein the size of the area of not comprising the first deep well is smaller than the size of the first pixel area.

10. The method for forming an image sensing device as claimed as claimed in claim 1, further comprising an isolation structure and an isolating well of the first conductivity type under the isolation structure to make the first pixel area, the second pixel area and the third pixel area isolated from each other.

* * * * *